(12) United States Patent
Varnica et al.

(10) Patent No.: US 9,577,675 B1
(45) Date of Patent: Feb. 21, 2017

(54) SYSTEM AND METHOD FOR ENCODING USER DATA WITH LOW-DENSITY PARITY-CHECK CODES WITH FLEXIBLE REDUNDANT PARITY CHECK MATRIX STRUCTURES

(71) Applicant: Marvell International LTD., Hamilton (BM)

(72) Inventors: Nedeljko Varnica, San Jose, CA (US); Dung Viet Nguyen, San Jose, CA (US); Shashi Kiran Chilappagari, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 170 days.

(21) Appl. No.: 14/520,730

(22) Filed: Oct. 22, 2014

Related U.S. Application Data

(60) Provisional application No. 61/911,258, filed on Dec. 3, 2013.

(51) Int. Cl.
*H03M 13/00* (2006.01)
*H03M 13/11* (2006.01)

(52) U.S. Cl.
CPC .............................. *H03M 13/1174* (2013.01)

(58) Field of Classification Search
CPC ............ H03M 13/1174; H03M 13/036; H03M 13/1154; H03M 13/23; H03M 13/616; H03M 13/635; H03M 13/116; H03M 13/1111; H03M 13/6306; H03M 13/6393; H03M 13/1165; H03M 13/1185; H03M 13/611; H03M 13/6502; H03M 13/6561; H04L 1/0061; H04L 1/0057

See application file for complete search history.

(56) References Cited

U.S. PATENT DOCUMENTS

| | | | |
|---|---|---|---|
| 8,095,859 B1 * | 1/2012 | Peterson | H03M 13/116 714/801 |
| 2003/0079171 A1 * | 4/2003 | Coe | H03M 13/1111 714/758 |
| 2006/0109821 A1 * | 5/2006 | Xia | H03M 13/116 370/335 |
| 2008/0040644 A1 * | 2/2008 | Spencer | H03M 13/09 714/758 |

(Continued)

OTHER PUBLICATIONS

IEEE Std. 802.11-2012; IEEE Standard for Information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Mar. 29, 2012; 2793 pages.

(Continued)

*Primary Examiner* — Guerrier Merant

(57) ABSTRACT

A system including a first module, a second module and a third module. The first module is configured to generate a first parity check matrix. The second module is configured to append an appended matrix to the first parity check matrix to generate a resultant parity check matrix. The appended matrix includes additional elements. The third module is configured to receive user data and encode the user data based on the resultant parity check matrix.

21 Claims, 8 Drawing Sheets

(56) References Cited

U.S. PATENT DOCUMENTS

| | | | | |
|---|---|---|---|---|
| 2009/0106625 | A1* | 4/2009 | Jun | G11B 20/18 |
| | | | | 714/758 |
| 2010/0229066 | A1* | 9/2010 | Matsumoto | H03M 13/116 |
| | | | | 714/752 |
| 2010/0325511 | A1* | 12/2010 | Oh | H03M 13/116 |
| | | | | 714/752 |
| 2011/0283159 | A1* | 11/2011 | Yuan | H03M 13/6516 |
| | | | | 714/752 |
| 2012/0173949 | A1* | 7/2012 | Liu | H03M 13/116 |
| | | | | 714/752 |
| 2012/0198306 | A1* | 8/2012 | Myung | H03M 13/6306 |
| | | | | 714/758 |
| 2013/0297993 | A1* | 11/2013 | Murakami | H03M 13/036 |
| | | | | 714/786 |
| 2014/0129898 | A1* | 5/2014 | Letunovskiy | H03M 13/015 |
| | | | | 714/755 |
| 2014/0223254 | A1* | 8/2014 | Pisek | H03M 13/033 |
| | | | | 714/755 |

OTHER PUBLICATIONS 802.16-2009 IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.

IEEE Std 802.20-2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1032 pages.

"Specification of the Bluetooth System" Master Table of Contents & Compliance Requirements—Covered Core Package version: 4.0; Jun. 30, 2010; 2302 pages.

IEEE P802.11ac / D2.1; Draft Standard for Information Technology—Telecommunications and information exchange between systems—Local and metropolitan area networks—Specific requirements; Part 11: Wireless LAN Medium Access Control (MAC) and Physical Layer (PHY) specifications; Amendment 4: Enhancements for Very High Throughput for Operation in Bands below 6 GHz; Prepared by the 802.11 Working Group of the 802 Committee; Mar. 2012; 363 pages.

IEEE P802.11ad / D5.0 (Draft Amendment based on IEEE P802.11REVmb D10.0) (Amendment to IEEE 802.11REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.

IEEE P802.11ah / D1.0 (Amendment to IEEE Std 802.11REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.

* cited by examiner

SYSTEM AND METHOD FOR ENCODING USER DATA WITH LOW-DENSITY PARITY-CHECK CODES WITH FLEXIBLE REDUNDANT PARITY CHECK MATRIX STRUCTURES

CROSS-REFERENCE TO RELATED APPLICATIONS

This application claims the benefit of U.S. Provisional Application No. 61/911,258, filed on Dec. 3, 2013. The entire disclosure of the application referenced above is incorporated herein by reference.

FIELD

The present disclosure relates to encoding and decoding, and more particularly to structures of parity check matrices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

When data is sent across a communications channel, noise and other distortions of the channel may alter the data by the time the data is received. Various error detection and error correction mechanisms are used to detect and possibly correct such errors. One class of error correcting codes (ECC) is linear block ECCs, which include low-density parity check (LDPC) codes.

An LDPC code is a linear code defined by a parity-check matrix H having a low density and thus a small number of 1s per column. The parity-check matrix H can be represented by a bipartite Tanner graph where each column of H is represented by a transmitted variable node, each row by a check node, and each "1" in H by a graph edge connecting a variable node and a check node corresponding to a column-row location of the "1". The Tanner graph may additionally have non-transmitted variable nodes. Each check node defines a parity check operation.

When using an LDPC code, user data is divided into blocks of K bits or symbols. Each of the blocks is mapped, or encoded, into a codeword having N bits or symbols, where N is greater than K. A number of redundant bits (referred to as "parity bits") in a LDPC code is N-K. Redundancy allows for detection and correction of errors. The more redundancy the more errors that can be corrected. LDPC codes may be characterized by a rate calculated by dividing K by N.

User data can be encoded by generating a parity-check matrix H, deriving a generator matrix G based on the parity check matrix H, and then encoding the user data based on the generator matrix G. The parity check matrix H has N columns and M rows. The number of encoded bits is equal to the number of columns N in the parity check matrix H. Each row of the parity check matrix H corresponds to a single parity check and a corresponding parity check equation. As an example, a first row of the parity check matrix H may indicate that for any LDPC codeword a modulo 2 of bits 0, 1 and N−1 of the parity check matrix H is 0. If the number of rows M in the parity check matrix H is equal to N-K, then the parity check matrix H is full rank and the number of parity bits is equal to the number of rows in the parity check matrix. If the number of rows M of a parity check matrix H is greater than N-K, then the parity check matrix H has one or more redundant rows. Redundant rows represent redundant parity checks.

The user data may be multiplied by the generator matrix to provide LDPC codewords. Each bit of an LDPC codeword corresponds to a column of the parity check matrix H. An LDPC codeword can be decoded using an iterative algorithm that passes messages along edges of the corresponding Tanner graph from variable nodes to check nodes and vice-versa until convergence is obtained, or a certain number of iterations is reached.

SUMMARY

A system is provided and includes a first module, a second module and a third module. The first module is configured to generate a first parity check matrix. The second module is configured to append an appended matrix to the first parity check matrix to generate a resultant parity check matrix. The appended matrix includes additional elements. The third module is configured to receive user data and encode the user data based on the resultant parity check matrix.

In other features, a fourth module is configured to determine a parameter. The first parity check matrix has a preset structure, parity check redundancy, and a first weighted profile. The second module is configured to, based on the parameter, append the appended matrix to the first parity check matrix to generate the resultant parity check matrix. The resultant parity check matrix has a second weighted profile.

In other features, a method is provided and includes: generating a first parity check matrix; appending an appended matrix to the first parity check matrix to generate a resultant parity check matrix, wherein the appended matrix includes additional elements; and receiving user data and encoding the user data based on the resultant parity check matrix.

In other features, the method further includes determining a parameter. The first parity check matrix has a preset structure, parity check redundancy, and a first weighted profile. The appended matrix is appended to the first parity check matrix based on the parameter. The resultant parity check matrix has a second weighted profile.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
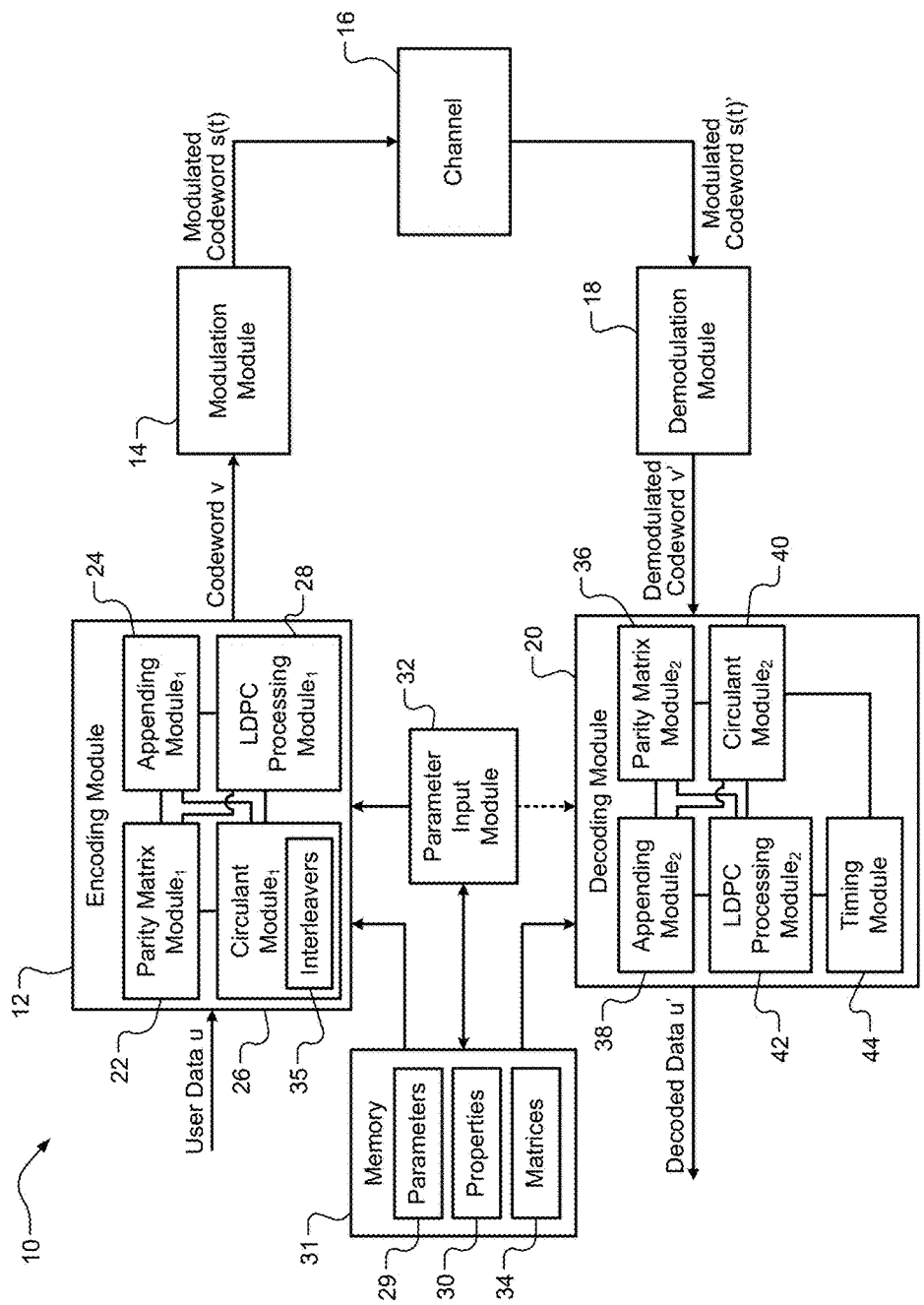
FIG. 1 is a functional block diagram of an error correction code (ECC) system in accordance with the present disclosure.

LDPC codes of a parity check matrix, with one or more redundant rows or columns (referred to as parity check redundancy), may provide improved decoding performance. This improved decoding performance can be provided in, for example, flash drives with bit flipping (BF) decoders and NAND flash memory.

Generally, parity check matrix properties of an LDPC code can affect the performance points, e.g. codeword failure rates and operating signal-to-noise ratios (SNRs) points. These performance points may depend on several parity check matrix properties. For example, having redundant rows (representing redundant parity checks) in the parity check matrix can facilitate in achieving desired column weight profiles (i.e. number of '1's and '0's in each column of the parity check matrices). The redundant parity checks can also provide improved code properties, such as an improved code distance spectrum and/or an improved trapping set spectrum (or distribution of trapping sets). In the systems, operating in SNR regions where codeword failures are rare, trapping sets may prevent a decoder from properly decoding an encoded codeword. Error floors (due to trapping sets) and miscorrections (due to low weights codeword errors) of a LDPC code may be observed depending on the corresponding distance spectrum and trapping set spectrum of the LDPC code. For example, in storage drive applications, if the distance spectrum and/or the trapping set spectrum is poor, then a large number of miscorrections and/or a large number of trapping set errors can result. Improving distance spectrum and/or trapping set spectrum of the LDPC code improves the performance in these critical aspects. Having redundant parity checks in the parity check matrix can result in improved distance spectrum and/or trapping set spectrum.

Traditional algebraic methods used to generate parity check matrices with parity check redundancy are limited in flexibility in design. This is because the number of rows and the number of columns of the parity check matrices are fixed values, which are based on corresponding algebraic methods including one or more algebraic functions used to generate the parity check matrices. Traditional algebraic methods require rigid (unchanged in size) structures. Limited parity check matrix sizes restrict code sizes and code rates. This renders the possibilities of using these traditional methods very limited.

Techniques are disclosed below that allow for adjusting, customizing, and controlling parity check matrix sizes, corresponding weighted profiles and other parameters of resultant parity check matrices. A weighted profile of a matrix refers to a number of 1's in each column and/or each row of a matrix. Granularity in the sizes of the parity check matrices and the flexibility to control other parameters of resultant parity check matrices improves code properties and as a result system performance. Applications (e.g., storage drive or wireless encoding and decoding systems) may have different amounts of allocated space (i.e. maximum sizes) for LDPC codes. For example, a certain application may allocate anywhere between 20 and 500 extra bytes for an ECC parity, e.g. parity of an LDPC code. The disclosed techniques allow for redundancy of parity check matrices to be controlled and customized and corresponding sizes of the parity check matrices to be optimized to fill allocated spaces for maximizing ECC performance.

FIG. 1 shows an ECC system 10 that includes an encoding module 12, a modulation module 14, a channel 16, a demodulation module 18 and a decoding module 20. The encoding module encodes received data u to generate a codeword v. The modulation module 14 modulates the codeword v to generate a modulated codeword signal s(t). The modulated codeword signal s(t) is provided to the channel 16. The demodulation module 18 receives and demodulates a modulated codeword signal s(t)' received from the channel 16 to provide a demodulated codeword v'. The de-modulated codeword signal s(t)' represents an estimate of the modulated codeword signal s(t) provided to the channel 16. The de-modulated codeword signal s(t)' may be different than the modulated codeword signal s(t) due to noise, transmission errors, etc. The decoding module 20 decodes and corrects errors in the demodulated codeword v' to provide decoded user data u'.

Figure 15:
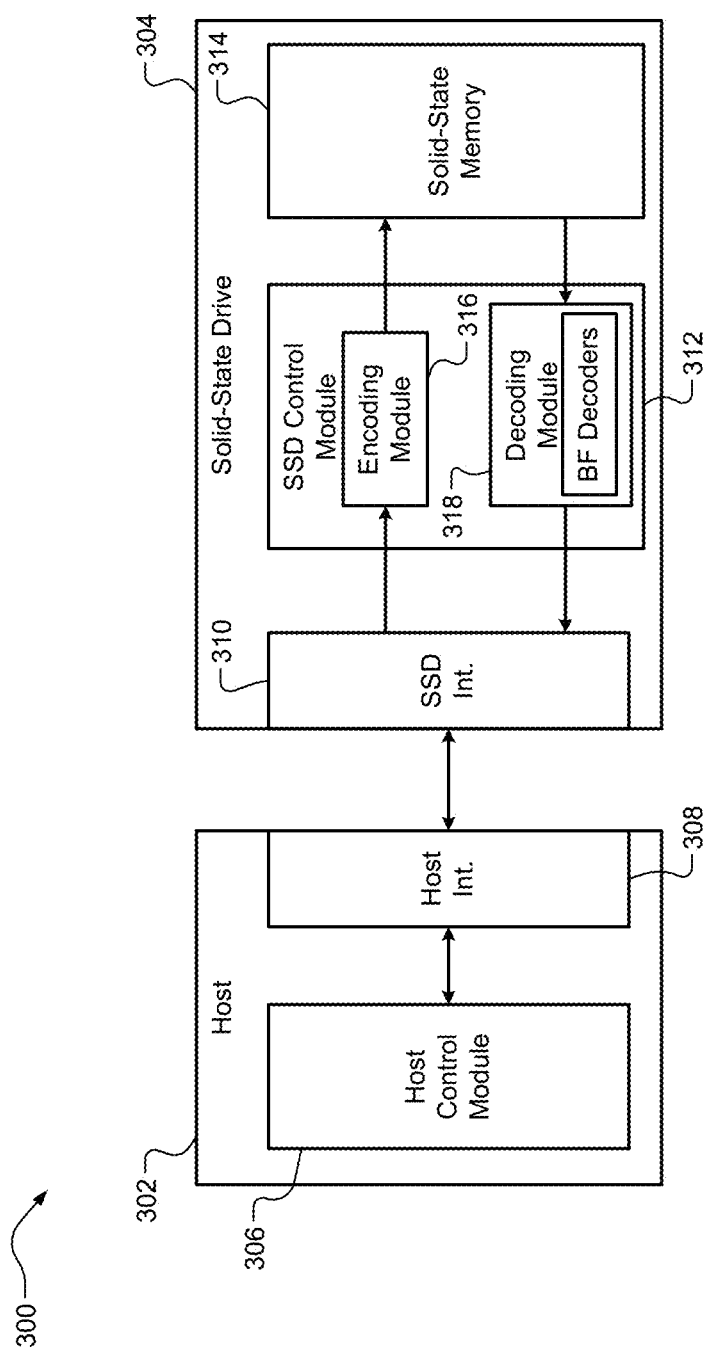
FIG. 15 is a functional block diagram of a storage system in accordance with the present disclosure.
Figure 16:
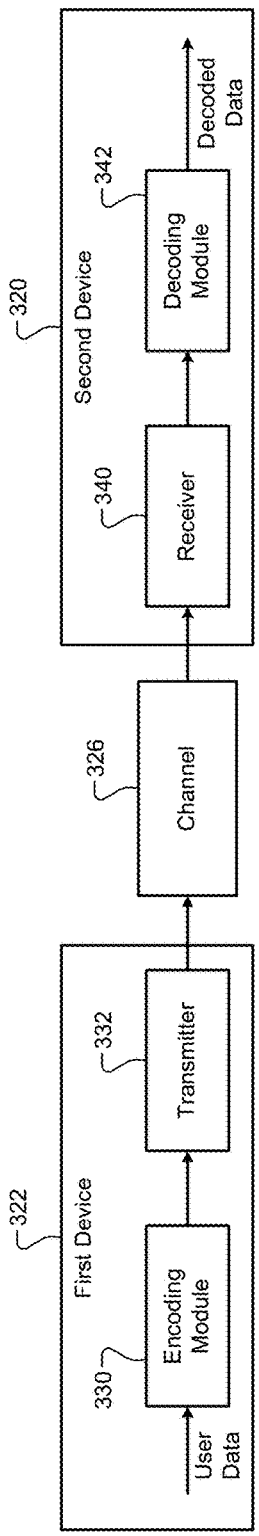
FIG. 16 is a functional block diagram of a wireless communication system in accordance with the present disclosure.
Figure 17:
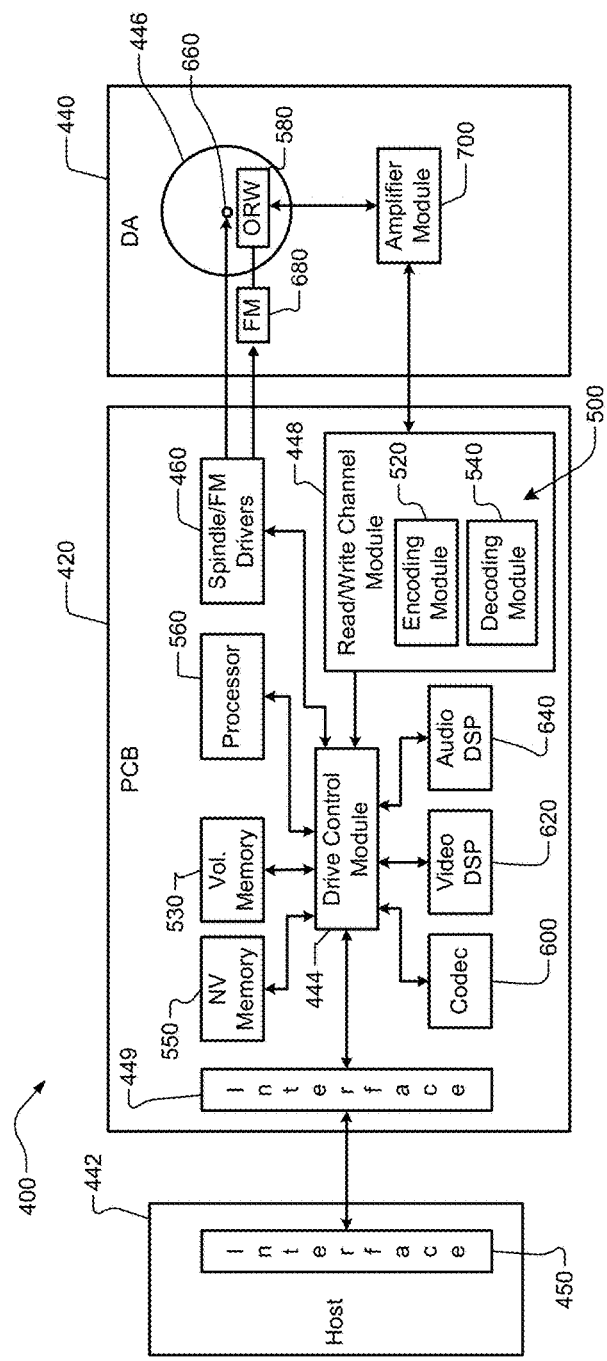
FIG. 17 is a functional block diagram of a storage drive in accordance with the present disclosure.

The ECC system 10 may be used in various applications, such as wireless communication applications and storage drive applications. The channel 16 may include, for example, a wireless transmission medium, a solid-state memory, and/or a rotating storage medium. An example of a solid-state drive application is illustrated by FIG. 15. An example of a wireless communication application is illustrated by FIG. 16. An example of another storage drive application including a rotating storage medium is illustrated by FIG. 17.

The encoding module 12 may include a parity matrix module 22, an appending module 24, a circulant module 26 and a LDPC processing module 28. The parity matrix module 22 generates first parity check matrices (referred to as "preset matrices"). The preset matrices may be generated using algebraic methods. The sizes and weighted profiles of the preset matrices are fixed and are based on the corresponding algebraic method, which is predetermined. Any algebraic methods known in the art may be used to generate the preset matrices.

The appending module 24 appends rows and/or columns (collectively referred to as dimensions) to the first matrices to generate resultant matrices (e.g., a resultant parity check matrix H). Matrices that are appended may or may not be redundant. Resultant parity check matrices provided as a result of the appending are redundant, i.e. the parity check matrices have some redundant dimensions (redundant parity checks). The selection of matrices to be appending is based on selected parameters and/or to satisfy one or more selected properties. The parameters may include: resultant parity check matrix sizes including row sizes and column sizes; weighted profiles of the resultant parity check matrix; number of redundant rows in the resultant parity check matrix; number of added rows in the resultant parity check matrix; and number of added columns in the resultant parity check matrix. A parity check matrix with a rank that is less than a total number of rows in the parity check matrix has row redundancy. Additional parameters are disclosed below.

The appending module 24 may provide additional rows or columns with a goal to satisfy and/or provide certain properties, such as, a certain girth of a graph corresponding to the resultant parity check matrix, ease of encoding (e.g., having a certain structure or shape of the corresponding resultant parity check matrix), and/or ease of decoding (e.g., having a certain column weight profile and other desired properties in the corresponding resultant parity check matrix). A girth of a graph corresponding to the resultant parity check matrix refers to a length of a shortest cycle of the graph. The stated parameters disclosed herein (collectively designated 29) and the stated properties disclosed herein (collectively designated 30) may be stored in a memory 31 and accessed by the modules 24, 26 and/or provided from a parameter input module 32 to the encoding module 12. In addition to the parameters 29 and the properties 30, the memory 31 may also store parity check matrices 34. The parity check matrices 34 may include the preset matrices and the resultant parity check matrices.

The parameter input module 32 may receive and/or determine the parameters 29 and/or the properties 30. The parameters 29 and/or properties 30 may be received from, for example, a host via one or more interfaces. Examples of hosts and interfaces are shown in FIGS. 15-17.

The circulant module 26 may control circulant sizes, weighted profiles, numbers of circulants, and circulant structures of the preset matrices and matrices appended to the preset matrices. A circulant refers to a matrix where each row vector is rotated (cyclically shifted) one element to the right or left relative to a preceding or subsequent row vector. The circulant module 26 may include one or more interleavers 35, which may interleave rows and/or columns of one or more circulants and/or matrices. Operation of the modules 24, 26 is further described below with respect to at least FIGS. 2-12.

The LDPC processing module 28 generates codewords based on resultant parity check matrices. The LDPC processing module 28 may access the resultant parity check matrices stored in the memory 31. The LDPC processing module 28 may generate a generator matrix G based on a resultant parity check matrix H and apply the generator matrix G to user data to generate codewords, which may then be stored and/or transmitted. In some embodiments, the LDPC processing module 28 may use resultant parity check matrix H in encoding user data into codewords.

The decoding module 20 may include a parity matrix module 36, an appending module 38, a circulant module 40, a LDPC processing module 42 and a timing module 44. In one embodiment, the appending module 38 and/or the circulant module 40 are not included. The parity matrix module 36 may generate, receive and/or access parity check matrices. The parity check matrices may be stored in the memory 31 and accessed by the parity matrix module 36. The parity check matrices may be preset matrices or may be resultant parity check matrices. The resultant parity check matrices may have corresponding parameters set by, for example, the parameter input module 32.

The modules 38, 40 may be used to interpret redundancy and/or circulant structures of the resultant parity check matrices. This may be based on resultant parity check matrices generated by the encoding module 12, modifications to preset matrices performed by the encoding module 12, the parameters 29 and/or the properties 30. The modules 38, 40 may determine which rows and/or columns of a preset matrix and/or portions thereof were appended and provided by the parity check module 36. For example, the modules 38, 40 may be used to regenerate a resultant parity check matrix previously generated by the encoding module 12. The timing module 44 provides timing for decoder processing of circulants of a parity check matrix, where the circulants may have different sizes. Operation of the timing module 44 is further described below with respect to FIG. 2.

Figure 2:
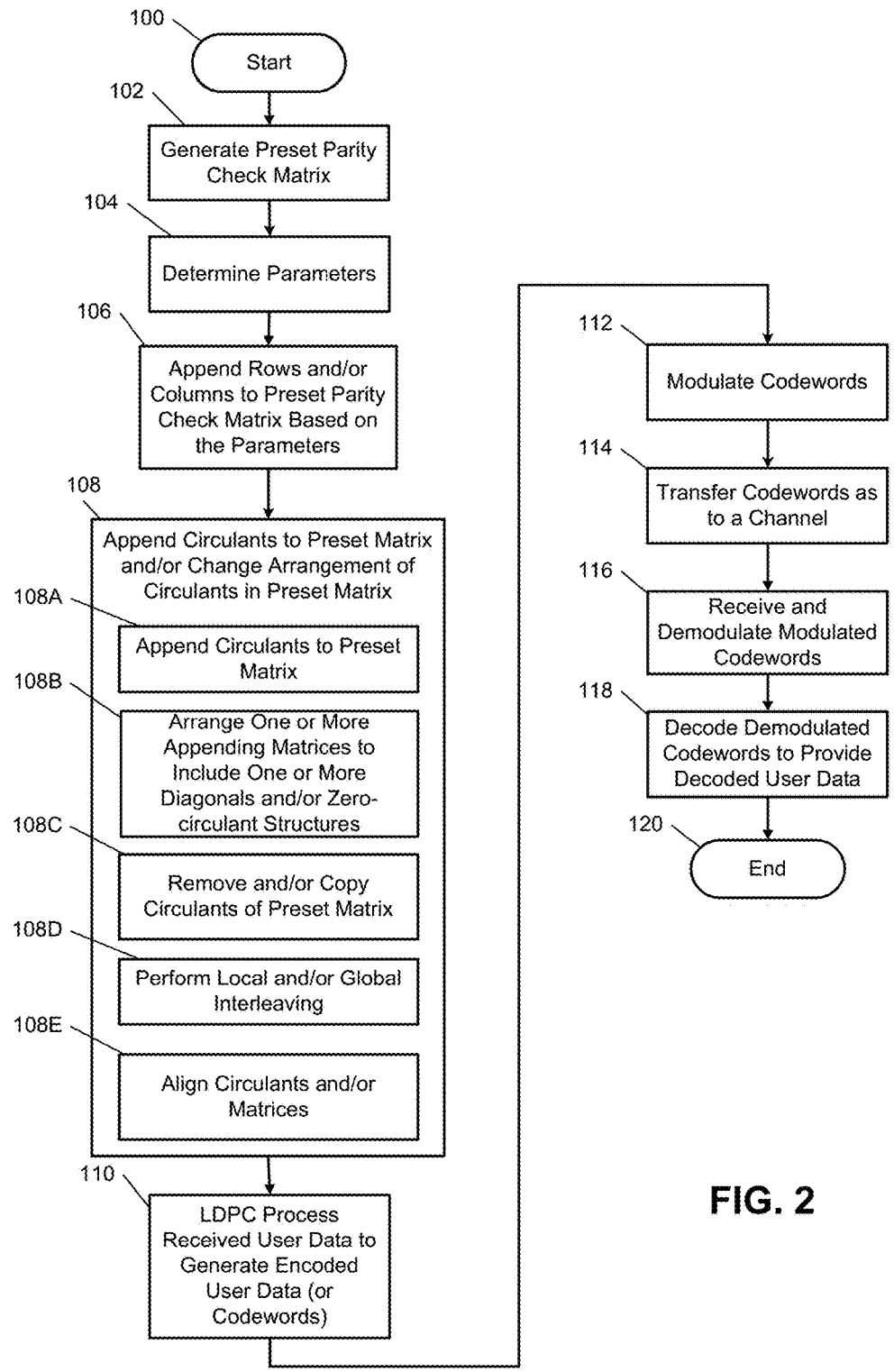
FIG. 2 illustrates an ECC method in accordance with the present disclosure.

The ECC system 10 may be operated using numerous methods, an example method is illustrated in FIG. 2. In FIG. 2, an ECC method of operating the ECC system 10 is shown. Although the following tasks are primarily described with respect to the implementations of FIGS. 1-14, the tasks may be easily modified to apply to other implementations of the present disclosure. The tasks may be iteratively performed.

The method may begin at 100. In one embodiment, the following tasks 102-108 are performed once (offline). In this example embodiment, tasks 110-118 may be performed for multiple codewords based on a matrix (or matrices) determined prior to and/or offline via the single execution of tasks 102-108. In another embodiment, tasks 102-108 are performed for each iteration of tasks 110-118.

At 102, the parity matrix module 22 of the encoding module 12 generates a preset matrix, as described above. The preset matrix has a known preset algebraic structure or some other structure with redundant rows (redundant parity checks). This preset matrix may be used as a building block or set of building blocks (matrices included in the preset matrix) from which a resultant parity check matrix is to be built. The preset matrix may be referred to as a base matrix, as the preset matrix is the initial building block upon which additional rows and/or columns are appended in the following tasks. The preset matrix may be of any size and has parity check redundancy in the form of redundant parity checks (redundant rows). Some or all circulants of the preset matrix may be non-zero-circulants. A non-zero-circulant is a circulant that includes one or more bits that are not 0.

At 104, the parameter input module 32 may determine, receive, and/or access one or more of the parameters 29. The following tasks 106-108 are performed to provide a resultant parity check matrix satisfying one or more of the stated parameters. The parameters may include the above-stated parameters and/or one or more of the below stated parameters.

At 106, the appending module 24 appends additional/rows columns to the preset matrix to satisfy one or more of the stated parameters. As an example, the appending module 24 may add rows and/or columns to provide a resultant parity check matrix having a certain size, a certain number of rows, a certain number of columns and/or a certain weighted profile. Additional rows/columns may be appended to provide a resultant parity check matrix that includes matrices (referred to as sub-matrices) having respective sizes and respective weighted profiles.

The appended rows and/or columns may be: pseudo-randomly selected; randomly selected; selected based on the preset matrix; selected using a greedy random-based search algorithms for good LDPC codes; selected using a progressive edge growth algorithm; and/or selected using another suitable technique.

Figure 3:
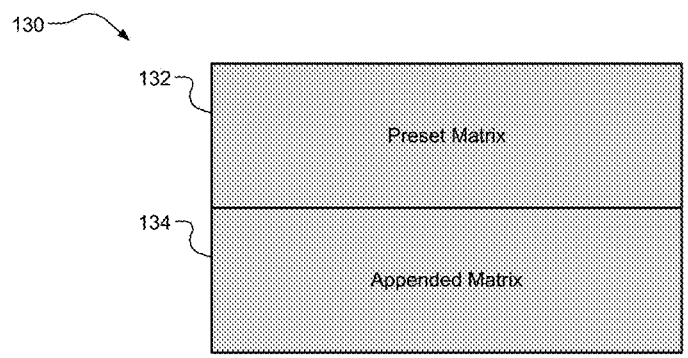
FIG. 3 illustrates a resultant parity check matrix including an appended matrix in accordance with the present disclosure.
Figure 4:
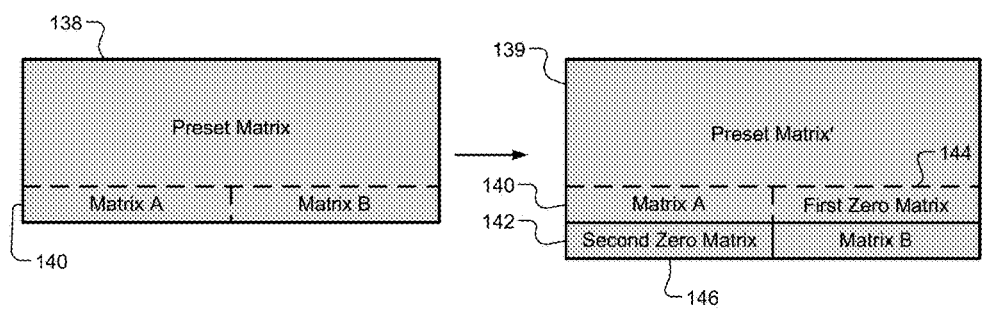
FIG. 4 illustrates extending a parity check matrix to include an appended matrix that includes a zero-matrix in accordance with the present disclosure.
Figure 5:
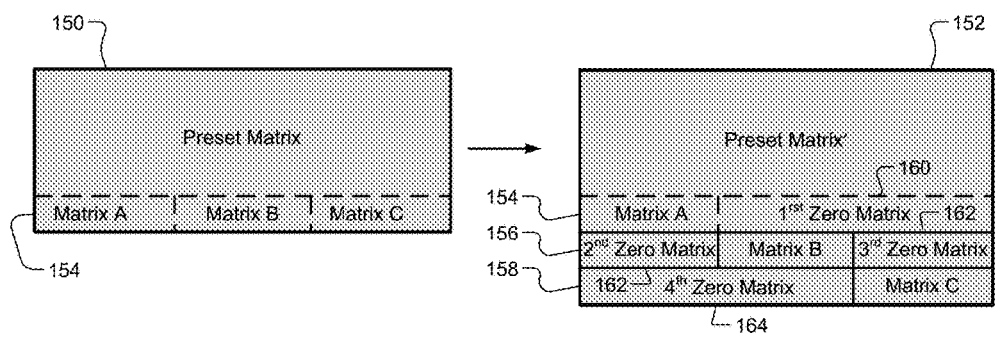
FIG. 5 illustrates extending a parity check matrix to include multiple appended matrices with respective zero-matrices in accordance with the present disclosure.

The following FIGS. 3-5 provide examples of appending rows and/or columns, which may be performed by the appending module 24. FIG. 3 shows a resultant parity check matrix 130 that includes a preset matrix 132, which may be the preset matrix provided at 102, and an appended matrix 134. The appended matrix 134 includes one or more rows and/or columns. The appended rows may be a same length as rows of the preset matrix 132. In addition or alternatively, one or more columns may be appended to the preset matrix 132. The number of appended rows and/or columns may be divisible by a number of rows and/or columns in the preset matrix 132.

FIG. 4 illustrates extending a parity check (or preset) matrix 138 to provide a resultant parity check matrix 139. The parity check matrix 138 may be the preset matrix 132 provided at 102 and may include one or more last rows 140. The last rows 140 may be divided into first portions and second portions. The first portions (identified as matrix A) remain in the parity check matrix 138. The second portions (identified as matrix B) are included as part of an appended matrix 142. Remaining portions 144 of the one or more last columns in rows 140 that do not include the matrix A are filled with 0s. Portions 146 of the appended matrix 142 that do not include the matrix B are filled with 0s. As a result, the resultant parity check matrix 139 includes (i) a modified preset matrix (identified as preset matrix') having the matrix A and a first zero-matrix, and (iii) the appended matrix 142 having a second zero-matrix and the matrix B. A zero-matrix may only include 0s. Bits of the matrix B, which are in the appended matrix 142, may be in the same columns of the resultant parity check matrix 139 as the bits were in prior to the transfer from the preset matrix 138 to the appended matrix 142.

FIG. 5 illustrates extending a parity check (or preset) matrix 150 to provide a resultant parity check matrix 152. The parity check matrix 150 may be the preset matrix 132 and may include one or more last rows 154. The one or more of the last rows 154 may be divided into respective first portions, second portions and third portions. The first portions (identified as matrix A) remain in the parity check matrix 150. The second portions (identified as matrix B) are included as part of a first appended matrix 156. The third portions (identified as matrix C) are included as part of a second appended matrix 158. Portions 160 of the one or more last columns in rows 154 that do not include the matrix A are filled with 0s. Portions 162 of the first appended matrix 156 that do not include the matrix B are filled with 0s. Portions 164 of the second appended matrix 158 that do not include the matrix C are filled with 0s.

As a result, the modified preset matrix (identified as preset matrix') of the resultant parity check matrix 152 includes the matrix A and a first zero-matrix. The first appended matrix 156 includes a second zero-matrix, the matrix B, and a third zero-matrix. The second appended matrix 158 includes a fourth zero-matrix and the matrix C. Bits of the matrix B, which are in the first appended matrix 156, may be in the same columns of the resultant parity check matrix 152 as the bits were in prior to the transfer from the parity check matrix 150 to the first appended matrix 156. Bits of the matrix C, which are in the second appended matrix 158, may be in the same columns of the resultant parity check matrix 152 as the bits were in prior to the transfer from the parity check matrix 150 to the second appended matrix 158.

Although shown in FIGS. 4-5 as being divided into equal portions, the last one or more rows of the preset matrices may be divided into unequal portions. Also, although bits of the divided portions may be transferred to different rows while remaining in the same columns of the resultant parity check matrices, the bits may be transferred to different columns. In addition, although the resultant parity check matrices are shown as including portions of the last one or more rows of the preset matrices, the portions may be of other rows of the preset matrices. Also, although the appended matrices are shown at ends of rows of the preset matrices, the appended matrices may be included in: rows at beginnings of the preset matrices; some other rows of the preset matrices. The preset matrices may be split row-wise and/or column-wise and the appended matrices may be appended between adjacent rows of the preset matrices and/or between adjacent columns of the preset matrices.

Referring again to FIG. 2 and as indicated at 108, the circulant module 26 may append one or more circulants to and/or arrange circulants of a preset matrix. The preset matrix may be (i) the preset matrix provided at 102, or (ii) a second matrix provided by the appending module 24 as a result of task 106. Rows and/or columns in the form of circulants may be appended, as generally indicated at 108*a*. The appended circulants may provide additional rows and/or columns and may be added to satisfy one or more of the above-stated parameters and/or properties. Note that tasks 106 and 108 may be performed separately or by the same module, such as by one of the appending module 24 and the circulant module 26. In some embodiments, task 106 or task 108 may not be performed.

Figure 6:
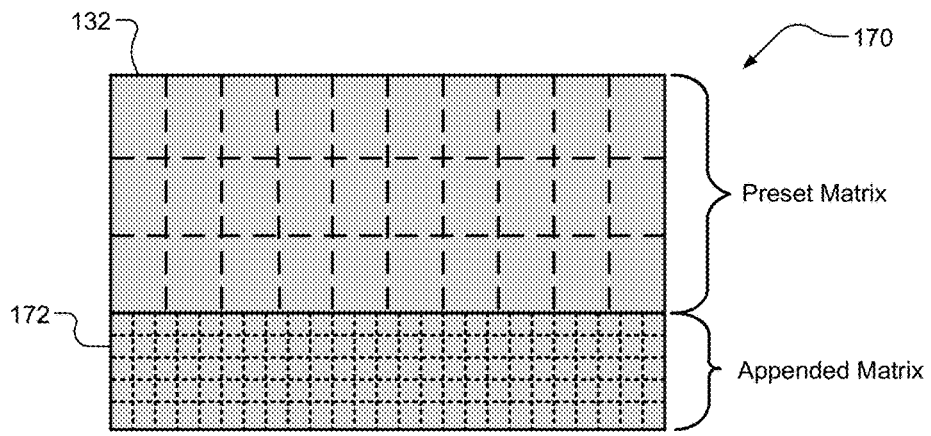
FIG. 6 illustrates a resultant parity check matrix including preset and appended matrices having different circulant sizes in accordance with the present disclosure.

FIG. 6 shows a resultant parity check matrix 170, which may include the preset matrix 132 provided at 102 and an appended matrix 172. The circulant module 26 may append one or more matrices (e.g., the matrix 172) to the preset matrix 132, where the one or more matrices may have circulant sizes that are different than circulant sizes of the preset matrix 132. An appended matrix refers to a matrix that is appended to a preset matrix and includes one or more additional rows and/or columns. An appended matrix may include one or more non-zero-circulants as shown in FIG. 6 and/or one or more zero-circulants. All entries (or bits) of a zero-circulant are 0. Dashed lines in the preset matrix 132 separate circulants of the preset matrix 132. Dashed lines of the appended matrix 172 separate circulants of the appended matrix 172. The appended matrix 172 as shown includes only non-zero-circulants (represented by gray boxes). In some embodiments, the appended matrix 172 may include zero-circulants.

The appended matrix 172 may have different circulant sizes than the preset matrix 132. As shown, the circulant sizes of the preset matrix 132 are larger than the circulant sizes of the appended matrix 172. In general, the circulant sizes of the preset matrix 132 may be smaller than, equal or larger than the circulant sizes of the appended matrix 172.

The appending of one or more matrices having different circulant sizes increases flexibility in providing a resultant parity check matrix with: a selected number of rows; a selected number of columns; a selected number of parity bits; one or more rows, columns and/or matrices with selected weighted profiles; etc. The appended circulants may be of any size. Each row may refer to a row of bits or a row of circulants. Each column may refer to a column of bits or a column of circulants. Each column may have a selected and/or different column weight. A column weight refers to a number of 1s in a column of a circulant, in a column of a matrix, and/or a number of non-zero-circulants in a column of a matrix. Similarly, each row may have a selected and/or different row weight. A row weight refers to a number of 1s in a row of a circulant, in a row of a matrix, and/or a number of non-zero-circulants in a row of a matrix. The circulant module 26 may determine weights of columns and/or rows of a resultant parity check matrix and alter a preset matrix and/or a received matrix (e.g., a matrix provided by the appending module 24) accordingly.

This allows a user and/or a system to provide a resultant parity check matrix that is customized for a particular application. Although the number of rows and columns, circulant sizes, and weighted profile of the preset matrix 132 are preset and are provided according to specific algebraic code constructions, the appended circulants allow for all of these parameters to be modified. A resultant parity check matrix may thus be customized to have an arbitrary number of rows and/or columns, an arbitrary number of circulants, one or more arbitrary circulant sizes, and/or an arbitrary weighted profile. The ability to control column weights allows for improved LDPC codes with improved decoding performance. The appended circulants may be selected and customized to provide a resultant parity check matrix with a selected rank.

The stated appending of circulants allows a column weight profile for a resultant parity check matrix to be selected and customized for a particular channel for best decoding performance. This column weight profile is provided while satisfying other parameters and/or properties. The selected parameters and/or properties, in addition to parameters and/or properties described above, may include a selected code size and/or code rate (e.g., number of user bits relative to a corresponding number of parity bits). An example of a parity check matrix having differently weighted columns is shown in FIG. 7.

Figure 7:
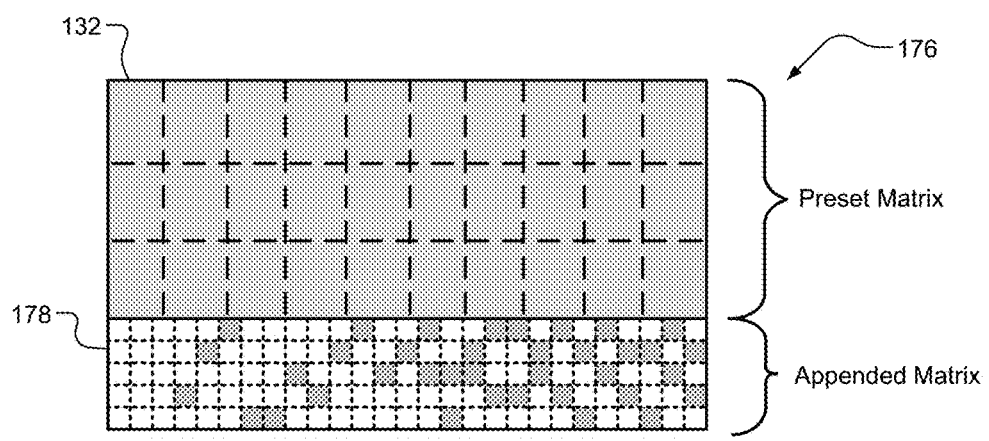
FIG. 7 illustrates a resultant parity check matrix including preset and appended matrices having different circulant sizes and the appended matrix having zero-circulants in accordance with the present disclosure.

FIG. 7 shows a resultant parity check matrix 176, which may include the preset matrix 132 provided at 102 and a appended matrix 178. The appended matrix 178 is appended by the circulant module 26 and may have a different circulant size than the preset matrix 132. The appended matrix 178 includes zero-circulants (represented by white boxes) and non-zero-circulants (represented by gray boxes). The appended matrix 178 may have any number of rows and/or columns, which may be selected by the circulant module 26. The circulant module 26 may select the number of circulants, number of zero-circulants, and distribution of the zero-circulants and the non-zero-circulants in the appended matrix 178 to satisfy one or more of the above-stated parameters and/or properties. The zero-circulants and the non-zero-circulants may be appended to any one or more rows and/or one or more columns of the preset matrix 132.

In the example shown, the preset matrix 132 includes 3 rows and 10 columns and the appended matrix 178 includes 5 rows and 27 columns. There are 2.7 times more columns in the appended matrix 178 than in the preset matrix 132. Although in the example shown the number of columns in the appended matrix 178 is not an integer multiple of the number of columns in the preset matrix 132, in some embodiments the number of columns in the appended matrix 178 may be an integer multiple of the number of columns in the preset matrix 132. For example, the appended matrix 178 may have 30 columns and thus have 3 times more columns than the preset matrix 132.

In the example in FIG. 7, each of the columns of the preset matrix 132 has a degree (or column weight) of 3. Each of the columns of the appended matrix 178 has a corresponding degree. Each of the columns 1-3 of the appended matrix 178 have a degree of 0 (i.e. no non-zero-circulants). Each of the cols. 4-14 of the appended matrix 178 have a degree of 1. Each of the cols. 15-27 of the appended matrix have a degree of 2. Thus, 11% of the columns in the appended matrix 178 have a degree of 0, 41% have a degree of 1, and 48% have a degree of 2. The addition of the appended matrix 178 to the preset matrix 132 provides the resultant parity check matrix 176 with a column weight profile where each of the cols. 1-3 have a degree of 3, each of the cols. 4-14 have a degree of 4, and each of the cols. 15-27 have a degree of 5. The degree of a column of the resultant parity check matrix 176 is equal to a degree of a corresponding column of the appended matrix 178 plus a degree of a corresponding column of the preset matrix 132.

The appending of the appended matrix 178 and/or one or more additional non-preset matrices to the preset matrix 132 provides ease in encoding and/or improves decoding. The circulant module 26 may determine the number of zero-circulants, non-zero-circulants and/or matrices to append to the preset matrix 132 to satisfy one or more of the above-stated parameters and/or properties.

The circulant module 26 may also reduce the number of rows and/or columns of the resultant parity check matrix 176 and/or the preset matrix 132. To reduce the number of rows and/or columns of the resultant parity check matrix 176, the number of rows, columns, and/or matrices appended to the preset matrix 132 may be reduced.

Additional techniques that may be used to alter structures of a resultant parity check matrix are described with respect to FIGS. 8-12. These structures may be provided by the circulant module 26 during task 108. The circulant module 26 may append appended matrices shown in the FIGS. 8-12 to corresponding preset matrices. Constraints, as described below, are placed on certain matrices appended to corresponding preset matrices.

Figure 8:
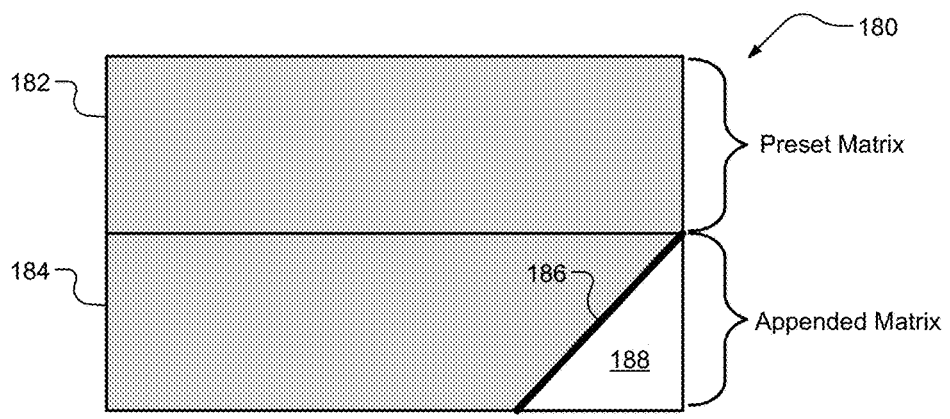
FIG. 8 illustrates a resultant parity check matrix including a appended matrix with a non-zero-circulant diagonal and a triangular zero-circulant structure in accordance with the present disclosure.

FIG. 8 shows a resultant parity check matrix 180 that includes a preset matrix 182 (e.g., the preset matrix provided at 102), an appended matrix 184 with a non-zero-circulant diagonal 186, and a triangular zero-circulant structure 188. Arrangement of an appended matrix to include a diagonal and a zero-circulant matrix is generally indicated at 108*b* in FIG. 2. The appended matrix 184 is appended to the preset matrix 182. Certain circulants of the appended matrix 184 are constrained to be non-zero-circulants while others are constrained to be zero-circulants. Circulants to the left (in columns with lower numbers than corresponding circulants of the diagonal 186) of the diagonal 186 may be non-zerocirculants. Circulants to the right (in columns with higher numbers than corresponding circulants of the diagonal 186) of the diagonal 186 are zero-circulants. The diagonal 186 may include non-zero-circulants. As shown, the diagonal 186 may (i) begin in the middle of one or more rows and at an end of one or more columns of the appended matrix 184, and (ii) end at an end of one or more rows of the appended matrix 184. The appended matrix 184 may have different circulant sizes than the preset matrix 182.

Figure 9:
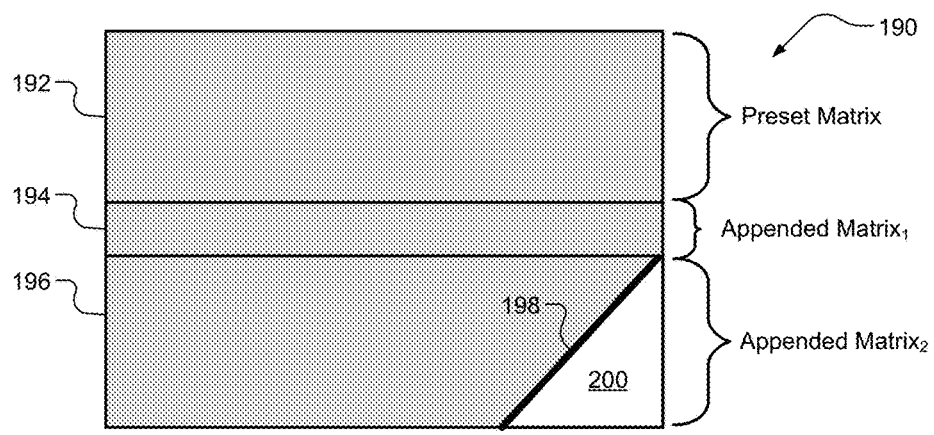
FIG. 9 illustrates a resultant parity check matrix including a first appended matrix and a second appended matrix with a non-zero-circulant diagonal and a triangular zero-circulant structure in accordance with the present disclosure.

FIG. 9 shows a resultant parity check matrix 190 that includes a preset matrix 192 (e.g., the preset matrix provided at 102), a first appended matrix 194, and a second appended matrix 196 with a non-zero-circulant diagonal 198 and a triangular zero-circulant structure 200. The first appended matrix 194 is appended to the preset matrix 192. The second appended matrix 196 is appended to the first appended matrix 194.

Certain circulants of the second appended matrix 196 are constrained to be non-zero-circulants while others are constrained to be zero-circulants. Circulants to the left (in columns with lower numbers than corresponding circulants of the diagonal 198) of the diagonal 198 may be non-zero-circulants. Circulants to the right (in columns with higher numbers than corresponding circulants of the diagonal 198) of the diagonal 198 are zero-circulants. The diagonal 198 may include non-zero-circulants. As shown, the diagonal 198 may (i) begin in the middle of one or more rows and at an end of one or more columns of the second appended matrix 196, and (ii) end at an end of a last row of the second appended matrix 196. Both first appended matrix 194 and second appended matrix 196 may have different circulant sizes than the preset matrix 192.

Figure 10:
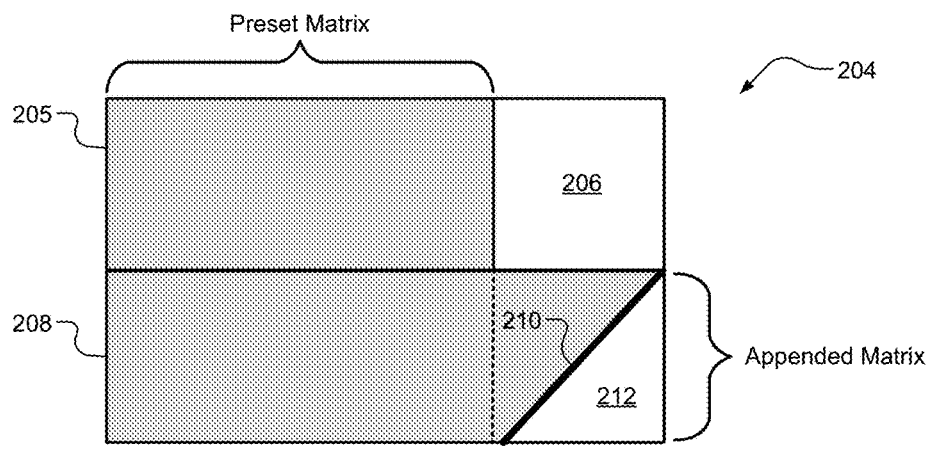
FIG. 10 illustrates a resultant parity check matrix including a zero-circulant matrix and an appended matrix having a non-zero-circulant diagonal and a triangular zero-circulant structure in accordance with the present disclosure.

FIG. 10 shows a resultant parity check matrix 204 that includes a preset matrix 205 (e.g., the preset matrix provided at 102) a zero-circulant matrix 206, a appended matrix 208 having a non-zero-circulant diagonal 210, and a triangular zero-circulant structure 212. The zero-circulant matrix 206 is appended to rows and a last column of the preset matrix 205. The appended matrix 208 is appended to the preset matrix 205 and the zero-circulant matrix 206. Certain circulants of the appended matrix 208 are constrained to be non-zero-circulants while others are constrained to be zero-circulants. Circulants to the left (in columns with lower numbers than corresponding circulants of the diagonal 210) of the diagonal 210 may be non-zero-circulants. Circulants to the right (in columns with higher numbers than corresponding circulants of the diagonal 210) of the diagonal 210 are zero-circulants. The diagonal 210 may include non-zero-circulants. As shown, the diagonal 210 may (i) begin in the middle of one or more rows and at an end of one or more columns of the appended matrix 208, and (ii) end at an end of one or more rows of the appended matrix 208. The appended matrix 208 may have different circulant sizes than the preset matrix 205.

Figure 11:
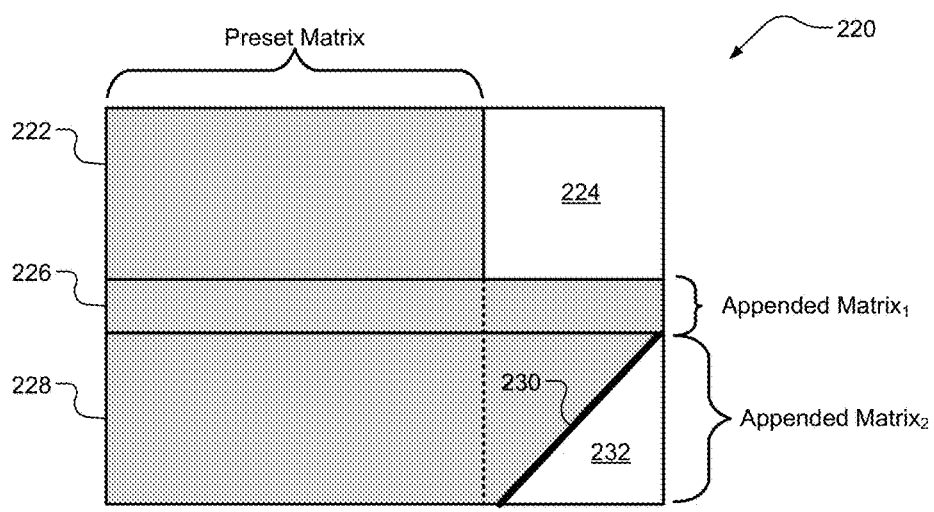
FIG. 11 illustrates a resultant parity check matrix including a zero-circulant matrix, a first appended matrix, and a second appended matrix with a non-zero-circulant diagonal and a triangular zero-circulant structure in accordance with the present disclosure.

FIG. 11 shows a resultant parity check matrix 220 that includes a preset matrix 222 (e.g., the preset matrix provided at 102), a zero-circulant matrix 224, a first appended matrix 226, and a second appended matrix 228 with a non-zero-circulant diagonal 230 and a triangular zero-circulant structure 232. The zero-circulant matrix 224 is appended to rows and a last column of the preset matrix 222. The first appended matrix 226 is appended to a last row of both the preset matrix 222 and the zero-circulant matrix 224. The second appended matrix 228 is appended to a last row of the first appended matrix 226.

Certain circulants of the second appended matrix 228 are constrained to be non-zero-circulants while others are constrained to be zero-circulants. Circulants to the left (in columns with lower numbers than corresponding circulants of the diagonal 230) of the diagonal 230 may be non-zero-circulants. Circulants to the right (in columns with higher numbers than corresponding circulants of the diagonal 230) of the diagonal 230 are zero-circulants. The diagonal 230 may include non-zero-circulants. As shown, the diagonal 230 may (i) begin in the middle of one or more rows and at an end of one or more columns of the second appended matrix 228, and (ii) end at an end of one or more rows of the second appended matrix 228. The appended matrices 226, 228 may have different circulant sizes than the preset matrix 222.

Figure 12:
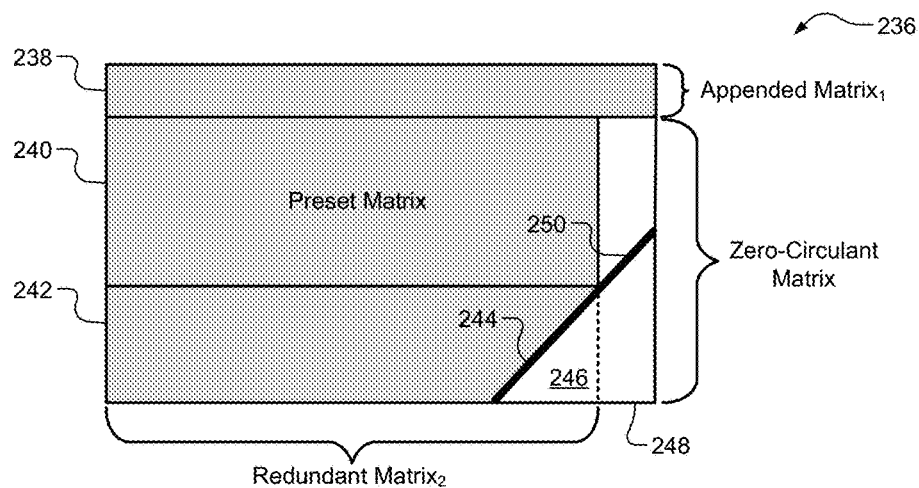
FIG. 12 illustrates a resultant parity check matrix including a first appended matrix, a second appended matrix with a non-zero-circulant diagonal and a triangular zero-circulant structure, and a zero-circulant matrix with a non-zero-circulant diagonal in accordance with the present disclosure.

FIG. 12 shows a resultant parity check matrix 236 that includes a first appended matrix 238, a preset matrix 240 (e.g., the preset matrix provided at 102), a second appended matrix 242 with a non-zero-circulant (or first) diagonal 244 and a triangular zero-circulant structure 246, and a circulant matrix 248 with a non-zero-circulant (or second) diagonal 250. The first appended matrix 238 is appended to (i) the first row and columns of the preset matrix 240, and (ii) the zero-circulant matrix 248. The second appended matrix 242 is appended to the last row and columns of the preset matrix 240. The zero-circulant matrix 248 is appended to the rows and the last column of both the preset matrix 250 and the second appended matrix 242.

Certain circulants of the second appended matrix 242 are constrained to be non-zero-circulants while others are constrained to be zero-circulants. Circulants to the left (in columns with lower numbers than corresponding circulants of the first diagonal 244) of the first diagonal 244 may be non-zero-circulants. Circulants to the right (in columns with higher numbers than corresponding circulants of the first diagonal 244) of the first diagonal 244 are zero-circulants. The first diagonal 244 may include non-zero-circulants. As shown, the first diagonal 244 may (i) begin in the middle of one or more rows and at an end of one or more columns of the second appended matrix 242, and (ii) end at an end of one or more rows of the second appended matrix 242. The appended matrices 238, 242 may have different circulant sizes than the preset matrix 240.

Certain circulants of the matrix 248 are constrained to be non-zero-circulants while others are constrained to be zero-circulants. Circulants above of the second diagonal 250 (in rows with lower numbers than corresponding circulants of the second diagonal 250) and below of the second diagonal 250 (in rows with higher numbers than corresponding circulants of the second diagonal 250) are zero-circulants. The second diagonal 250 may include non-zero-circulants and may be in-line with the first diagonal 244 such that the first diagonal 244 and the second diagonal 250 form a single diagonal. The single diagonal extends across portions of the second appended matrix 242 and the matrix 248.

The circulant module 26 may perform alternative and/or additional tasks. For example, in one embodiment, one or more of the zero or non-zero circulants in the appended matrices of FIGS. 8-12 are provided from the corresponding preset matrices. This can reduce the sizes of the preset matrices and ease encoding and/or improve decoding. In another embodiment, one or more zero or non-zero circulants in the preset matrices are moved to other locations in the preset matrices. This may include swapping a circulant in a preset matrix with a circulant in the preset matrix and/or shifting circulants of the preset matrix.

In another embodiment the circulant module 26 interleaves rows and/or columns of preset matrices and/or of one or more circulants of the preset matrices. This may include interleaving rows and/or columns of preset matrices with some number of zero-circulants. Rows and/or columns may then be appended to parity check matrices resulting from the interleaving, as described above. The interleaving and/or appending of rows and/or columns may be performed to provide zero-circulant structures and/or matrices (e.g., the zero-circulant structures and/or matrices of FIGS. 8-12). The zero-circulant structures may overlap a preset matrix and one or more appended matrices in a resultant parity check matrix. In another embodiment, circulants removed from a preset matrix and/or copied may be used to form one or more of the above-described zero-circulant structures and/or matrices. Removal and/or copying of circulants in a preset matrix are generally indicated at 108C in FIG. 2.

The above-described tasks performed by the modules 24, 26 may be based on a channel over which generated codewords are to be transferred. Codewords may be transferred over one or more channels. The tasks may be based on a channel identifier and/or decoding performance associated with the channels (e.g., a number of errors detected during decoding with respect to each of the channels).

As another example, the parameter input module 32 may change one or more of the above-described parameters and/or properties based on a number of decoding errors associated with one or more channels. The appending module 24 and/or the circulant module 26 may then satisfy the parameters and/or properties as described above. Alternatively, the appending module 24 and/or the circulant module 26 may adjust how preset matrices are changed to generate resultant parity check matrices based on decoding performance. This may include adjusting any of the above-described tasks performed by the modules 24, 26. For example, to improve decoding over certain channels, an order of columns of an appended matrix and/or a resultant parity check matrix may be altered such that consecutive bits transferred over the channels (i.e. transferred in a channel domain) have corresponding bits in the resultant parity check matrix, which are not consecutive.

If interleaving of rows and/or columns of a preset matrix, an appended matrix and/or a resultant parity check matrix is performed, each block of bits may be interleaved separately by a respective one of the interleavers 35. Interleaving is generally indicated at 108D of FIG. 2. A block of bits refers to columns of one or more circulants (block of columns) in the stated matrices. As a result, different blocks of columns may have respective interleavers (referred to as local interleaving). This can be helpful for non-I.I.D. channels with memory (sometimes referred to as memory channels). A memory channel is a communication channel for which statistical properties of an output signal at a time t are determined based on (i) an input signal transmitted at time t, and (ii) a signal transmitted prior to time t and/or a signal transmitted subsequent to time t.

Subsequent to performing local interleaving, global interleaving may be performed. Global interleaving may include changing an order of rows and/or columns of a preset matrix, an appended matrix and/or a resultant parity check matrix. Global interleaving may be performed using a single interleaver (e.g., one of the interleavers 35). Local interleaving may not need to be performed for memoryless channels. A memoryless channel is a communication channel for which statistical properties of an output signal at a time t are determined based only on an input signal transmitted at time t. The statistical properties of a memoryless channel are consequently not dependent on a signal transmitted prior to or after time t.

For example purposes only, the above-described figures show a certain number of diagonals, the diagonals have certain starting and ending locations, and the zero-circulant structures have certain shapes. The resultant parity check matrices and/or the appended matrices may include any number of diagonals. The included diagonals may start and end at other locations. The zero-circulants structures may have different shapes (e.g., non-triangular and/or non-rectangular structures).

Note that the tasks performed by the appending module 24 may be performed prior to and/or subsequent to any of the tasks performed by the circulant module 26. Also, the tasks performed by each of the appending module 24 and the circulant module 26 may be iteratively performed for each of one or more resultant parity check matrices. This can ease encoding and/or decoding.

The above-described tasks may include (i) aligning circulants of a preset matrix, one or more appended matrices, and/or a resultant parity check matrix, and/or (ii) altering sizes of a preset matrix, one or more appended matrices, and/or a resultant parity check matrix. Alignment of circulants and/or matrices is generally indicated at 108E of FIG. 2. Alignment of circulants may include adjust sizes of one or more circulants to provide a resultant parity check matrix with a rectangular structure. This may include aligning circulant sizes of appended circulants with circulant sizes and/or an overall size of a preset matrix. For example, a number of columns in one or more of the circulants of a preset matrix may be divisible by a number of columns in one or more circulants of an appended matrix. This may be desirable in embodiments in which the overall number of rows in a preset matrix may be equal to an overall number of rows in an appended matrix, and/or in the embodiments in which the overall number of columns in a preset matrix may be equal to an overall number of columns in an appended matrix.

A number of rows and/or columns in each appended section of a resultant parity check matrix may be a multiple of a number of rows and/or columns in a corresponding preset matrix. A number of bits and/or bytes in each row and/or column of a resultant parity check matrix may be a multiple of a number of bits and/or bytes in a corresponding preset matrix.

A circulant size of a preset matrix may be denoted as CSbase. A circulant size of appended matrix can be denoted CSapp. The appended matrix is appended to the preset matrix. An integer multiple X of CSapp may be equal to CSbase. The integer X may be selected to satisfy one or more of the above-stated parameters and/or properties and/or based on a corresponding channel (e.g., a channel identifier or decoding performance of the channel). If multiple circulant structures are included in a preset matrix and/or appended matrix, the sizes of the circulants in each of the preset and appended matrices may be selected such that a largest circulant size CSmax is equal to an integer multiple Y of a smallest circulant size CSmin. One or more other circulant sizes (e.g., $CS_A$ of a block A in the preset matrix and/or the appended matrix) may be an integer multiple of CSmin. The largest circulant size CSmax may be an integer multiple of one or more of the other circulant sizes.

Tasks associated with 108A-108E may be performed in various orders and/or repeated. Referring again to FIG. 2, the LDPC processing module 28 may encode the received data u based on the resultant parity check matrix provided by the parity matrix module 22, the appending module 24, and/or the circulant module 26. The encoded data may be provided as one or more codewords v. This may include generating a generator matrix G based on the resultant parity check matrix and generating the codewords v based on the generator matrix. In another embodiment, generating codewords v may be based directly on the resultant parity check matrix H. At 112, the modulation module 14 modulates the generated codewords v to generate a modulated codeword signal s(t).

At 114, the modulated codeword signal s(t) is transferred to the channel 16. This may include storing encoded data (or codewords) in memory and/or wirelessly transmitting the encoded data between network devices. The memory may include a disk and/or solid-state memory, examples of which are shown in FIGS. 15 and 17. Wireless transmission is shown in FIG. 16.

At 116, the demodulation module 18 may receive a modulated codeword signal s(t)' from the channel 16. At 118, the decoding module 20 may decode the modulated codeword signal s(t)' to provide decoded data u', as described above. The above-stated techniques performed by the encoding module 12 and/or one or more of the modules 22, 24, 26 and 28 of the encoding module 12 allow for efficient decoding of LDPC codewords as performed by the decoding module 20. This may include decoding based on a resultant parity check matrix having different circulant sizes.

Figure 13:
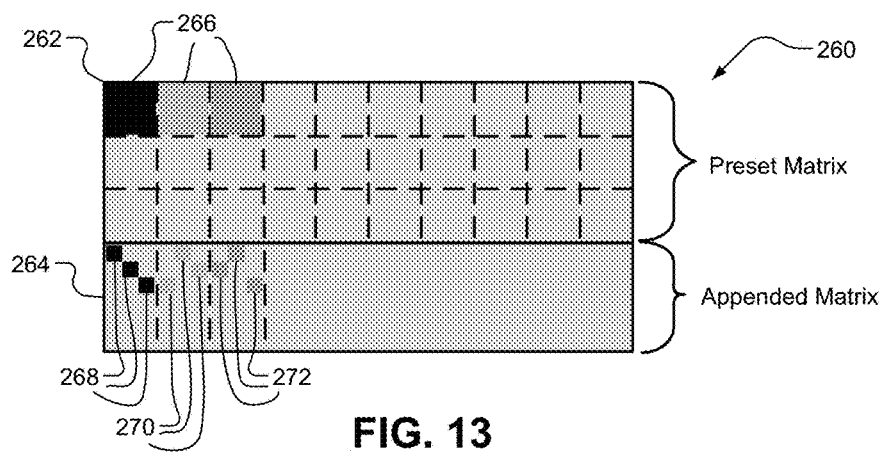
FIG. 13 illustrates decoder timing for a resultant parity check matrix having preset and appended matrices with different circulant sizes in accordance with an embodiment the present disclosure.
Figure 14:
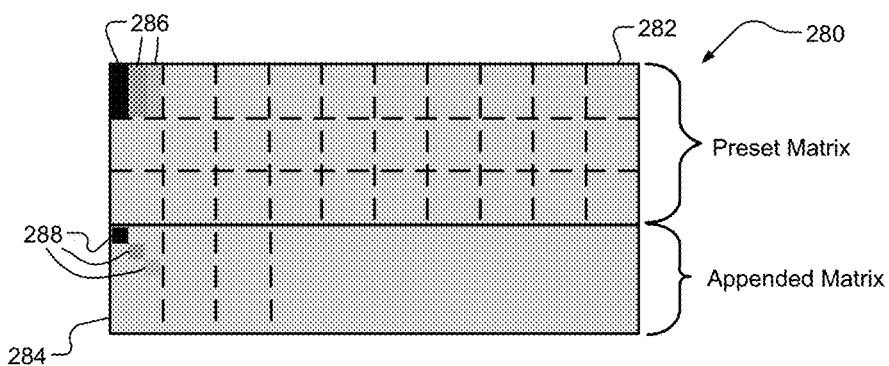
FIG. 14 illustrates decoder timing for a resultant parity check matrix having preset and appended matrices with different circulant sizes in accordance with another embodiment of the present disclosure.

The above-described alignment of rows and columns of preset and appended matrices allows for the following embodiments described with respect to FIGS. 13-14 to be performed. This is because boundaries in terms of rows and columns are aligned such that the number of large circulants of preset matrices are each divisible by a corresponding number of small circulants in appended matrices. In the following FIGS. 13 and 14, circulants of the same shaded color correspond with each other.

FIG. 13 illustrates one example embodiment for decoding a resultant parity check matrix 260 having different circulant sizes. The resultant parity check matrix 260 includes a preset matrix 262 and an appended matrix 264. The preset matrix 262 has larger circulants than the appended matrix 264. In this embodiment, the decoding module 20 processes each large circulant (circulants of the preset matrix 262) per allocated decoding time period (e.g. one or more clock cycles) and processes multiple small circulants (e.g., circulants of the appended matrix 264) per the decoding time period. In the example shown, three large circulants 266 and corresponding small circulants 268, 270, 272 are identified and have corresponding shading. As an example, a large circulant may be decoded during a first time period (e.g. first clock cycle) and the small circulants corresponding to the same columns in the matrix as the large circulant (with same shading in FIG. 13) may be decoded during the substantially same time period (e.g. during the same clock cycle). In the example shown, the small circulants (e.g., three small circulants) corresponding to a large circulant are processed during one of the decoding time periods. In the example shown, the size of the large circulants is 3 times the size of the small circulants.

FIG. 14 illustrates another example embodiment for decoding a resultant parity check matrix 280 having different circulant sizes. The resultant parity check matrix 280 includes a preset matrix 282 and an appended matrix 284. The preset matrix 282 has larger circulants than the appended matrix 284. In the example shown, three portions 286 of a large circulant and corresponding small circulants 288 are identified and have corresponding shading. In this embodiment, the decoding module 20 processes each small circulant (circulant of the appended matrix) per allocated decoding time period (e.g. one or more clock cycles) and processes each large circulant (e.g., circulant of the preset matrix) over multiples of the decoding time period. As an example, each of the small circulants may be processed per clock cycle of the decoding module 20 and each of the large circulants may be processed over multiple clock cycles. The number of clock cycles used for processing one of the large circulants may be equal to how many times larger a large circulant is than a small circulant. As another example, a length of a row of a large circulant may be an integer multiple Z (e.g., 3) times longer than a length of a row of a small circulant. The larger circulant may be processed over z allocated decoding time periods (e.g., 3 clock cycles).

Although only two circulant sizes were described with respect to the embodiments of FIGS. 13-14, a resultant parity check matrix may have more than two different circulant sizes. Decoding may be adjusted to account for the different sizes similar to that described above. The timing may be adjusted to satisfy one or more of the above-described parameters and/or properties. The method may end at 120.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

FIG. 15 shows a storage system 300 that includes a host 302 and a solid-state drive (SSD) 304. The host 302 includes a host control module 306 and a host interface 308. The host control module 306 controls the host interface 308 and accesses the SSD 304. The SSD 304 includes a SSD interface 310 that is in communication with the host interface 308. The SSD 304 further includes a SSD control module 312 and solid-state memory 314 (e.g., NAND flash memory). The SSD control module 312 includes an encoding module 316 (e.g., the encoding module of FIG. 1) and a decoding module 318 (the decoding module of FIG. 1) having bit flipping decoders 317. The encoding module 316 may encode data and the decoding module 318 may decode demodulated codewords as described above with respect to FIG. 2. The channels described above with respect to the tasks of FIG. 2 may be located between the SSD control module 312 and the solid-state memory 314.

FIG. 16 shows a first device 322 that transmits data to a second device 324 over a communications channel 326 (e.g., the channel 16 of FIG. 1). For example only, the communications channel 326 may be a wired medium, such as twisted pair, or may be a wireless medium. For example, the devices 322 and 324 may implement a third or fourth generation mobile standard such as long term evolution (LTE), a wireless local area network (WLAN) such as WiFi, and/or WiMAX.

The first device 322 includes an encoding module 330 (e.g., the encoding module 12 of FIG. 1) that receives user data and generates encoded data. The encoding module 330 may implement one or more error-detecting and/or error-correcting schemes. For example only, the encoding module 330 may implement forward error correction, which adds redundant information to the user data to allow transmission errors to be corrected by the second device 324. The encoding module 330 may also implement error-detecting codes, which allow for errors to be detected, but not necessarily corrected. An error checking code is applied to the user data to create protected user data. The protected user data is then encoded with the error correcting code before being transmitted.

The devices 322 and 324 may be co-located. When co-located, the devices 322 and 324 may share some or all components. For example only, a digital signal processor (DSP) may perform some or all of the functions of the encoding module 330 and the decoding module 342. As another example, an amplifier or preamplifier may be shared by the transmitter 332 and the receiver 340.

The encoding module 330 provides the encoded data to a transmitter 332, which transmits the encoded data over the communications channel 326. A receiver 340 of the second device 324 may receive the encoded data from the communications channel 326. The received data is provided to a decoding module 342 (e.g., the decoding module 20 of FIG. 1). The decoding module 342 attempts to retrieve the original user data from a received modulated codeword signal as described above attempts to correct errors introduced by the communications channel 326.

In a broad sense, the communications channel 326 can be a storage medium. For example only, the storage medium may include a volatile memory, a non-volatile memory, and/or longer-term storage, such as a hard drive, an optical drive, or a tape drive. Storage devices may be thought of as communications channels because data that is transmitted (written) to the storage device may include errors when later received (read). Therefore, encoding according to the principles of the present disclosure may be used with storage devices. FIGS. 15 and 17 are examples of storage drives, respectively, including encoding and decoding functionality according to the principles of the present disclosure.

The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

FIG. 17 shows a storage drive 400. The storage drive 400 may be, for example, a Blu-ray disc (BD) drive, a digital versatile disc (DVD) drive, a hard disk drive, or other storage device that implements the encoding and decoding techniques disclosed herein. The storage drive 400 includes a printed circuit board (PCB) 420 and a drive assembly (DA) 440. The PCB 420 transfers data between the DA 440 and a host 442. The host 442 may be, for example, a computer, a multimedia device, a mobile computing device, etc. The PCB 420 may include a drive control module 444.

The drive control module 444 controls transfer of data between the DA 440 and the host 442. The drive control module 444 reads data from and writes data to a storage medium 446 of the DA 440 via a read/write channel module 448 and communicates with the host 442 via an input/output interface 449. The host 442 includes a corresponding input/output interface 450. The drive control module 444 coordinates timing of the read/write channel module 448, the input/output interface 449, and spindle/feed motor (FM) drivers 460 of the storage medium 446. Data is transferred between the drive control module 444 and the DA 440 via the read/write channel module 448 based on the coordinated timing.

The read/write channel module 448 includes an ECC system 500. The ECC system 500 includes an encoding module 520 (e.g., the encoding module of FIG. 1) and a decoding module 540 (e.g., the decoding module of FIG. 1). The encoding module 520 encodes bytes of the data being written to the storage medium 446 on the DA 440. According to the encoding techniques disclosed herein. The decoding module 540 decodes according to the decoding techniques disclosed herein and corrects bytes of data received from the storage medium 446 by performing an iterative decoding process. During the iterative decoding process, codewords and/or bytes are iteratively decoded and evaluated until no further codewords and/or bytes can be corrected.

The PCB 420 may further include a buffer (or volatile memory) 530, a non-volatile memory 550, and a processor 560. The buffer 530 stores read data, write data and/or control code that is associated with controlling operation of the storage drive 400. The nonvolatile memory 550 may include flash memory and may store data related to drive write formats and/or other nonvolatile control code. The processor 560 may perform data and/or control processing that is related to the operation of the storage drive 400. The processor 560 may also perform decoding of copy protection and/or compression/decompression as needed.

During write operations, the read/write channel module 448 encodes data to be written by a read/write device 580 to the storage medium 446 or storage media (e.g., one or more disc(s)). The read/write channel module 448 processes read and write signals for reliability and may apply, for example, an ECC, a LDPC code, a run-length-limited (RLL) code, and/or other suitable codes. During read operations, the read/write channel module 448 may convert an analog output of the read/write device 580 to a digital signal. The converted signal is then detected and decoded to recover the data that was previously written on the storage medium 446.

The PCB 420 may further include a codec module 600, a video digital signal processor (DSP) 620, and an audio DSP 640. The codec module 600 encodes and/or decodes video such as any of the Moving Picture Experts Group (MPEG) formats. The processors 620, 640 may be used to perform audio and/or video signal processing.

The DA 440 includes the storage medium 446 on which data is stored. The storage medium 446 is rotated by a spindle motor 660, which rotates based on signals from the spindle/FM drivers 460. The storage medium 446 is rotated at a controlled and/or variable speed during read/write operations. The read/write device 580 may include a laser and an optical sensor and may move relative to the storage medium 446 to read and/or write data to/from the storage medium 446.

The spindle/FM drivers 460 also generate control signals that position a feed motor 680, for example using a voice coil actuator, a stepper motor or any other suitable actuator. The feed motor 680 moves the read/write device 580 relative to the storage medium 446.

The DA 440 may further include an amplifier module 700. The amplifier module 700 may generate laser drive signals based on outputs of the read/write channel module 448. The amplifier module 700 may amplify read signals received from the read/write device 580. When reading data, the amplifier module 700 amplifies low level signals from the read/write device 580 and outputs the amplified signal to the read/write channel module 448.

Portions of the storage drive 400 may be implemented by one or more integrated circuits (IC) or chips. For example, the drive control module 444 and the processor 560 may be implemented by a single chip. The spindle/FM drivers 460 and/or the read/write channel module 448 may also be implemented by the same chip as the drive control module 444 and the processor 560. The components, modules, and processors of the PCB 420 may be implemented as a system-on-a chip (SOC).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory (such as flash memory), volatile memory (such as static random access memory and dynamic random access memory), magnetic storage (such as magnetic tape or hard disk drive), and optical storage.

The apparatuses and methods described in this application may be partially or fully implemented by one or more computer programs executed by one or more processors. The computer programs include processor-executable instructions that are stored on at least one non-transitory, tangible computer-readable medium. The computer programs may also include and/or rely on stored data.

What is claimed is:

1. A system comprising:
   a first module configured to generate a first parity check matrix;
   a second module configured to append an appended matrix to the first parity check matrix to generate a resultant parity check matrix, wherein appending the appended matrix to the first parity check matrix includes appending additional elements to the first parity check matrix; and
   a third module configured to (i) generate the appended matrix to include (a) a diagonal with non-zero-circulants and (b) a zero-circulant structure, and (ii) receive user data and encode the user data based on the resultant parity check matrix, wherein the zero-circulant structure includes a plurality of zero-circulants.

2. The system of claim 1, further comprising a fourth module configured to determine a parameter, wherein:
   the first parity check matrix has a preset structure, parity check redundancy, and a first weighted profile;
   the second module is configured to, based on the parameter, append the appended matrix to the first parity check matrix to generate the resultant parity check matrix; and
   the resultant parity check matrix has a second weighted profile.

3. The system of claim 1, wherein:
   the first module is configured to perform an algebraic function to provide the first parity check matrix having a preset structure; and
   the preset structure has a preset size and a first weighted profile.

4. The system of claim 1, wherein:
   the third module is configured to, based on a parameter, append the appended matrix to the first parity check matrix; and
   the parameter is a selected number of dimensions for the appended matrix or a selected number of dimensions for the resultant parity check matrix.

5. The system of claim 1, wherein:
   the third module is configured to, based on a parameter, append the appended matrix to the first parity check matrix; and
   the parameter is a size of the resultant parity check matrix.

6. The system of claim 1, wherein:
   the third module is configured to, based on a parameter, append the appended matrix to the first parity check matrix; and
   the parameter is based on encoded data.

7. The system of claim 1, wherein:
   the third module is configured to, based on a property, append the appended matrix to the first parity check matrix; and
   the property is a girth of a graph corresponding to the resultant parity check matrix.

8. A system comprising:
   a first module configured to generate a first parity check matrix;
   a second module configured to append an appended matrix to the first parity check matrix to generate a resultant parity check matrix, wherein appending of the appended matrix to the first parity check matrix includes adding additional elements to the first parity check matrix; and
   a third module configured to receive user data and encode the user data based on the resultant parity check matrix, wherein
   the first parity check matrix includes a plurality of rows,
   the plurality of rows include a first row, and
   the third module is configured to divide the first row of the first parity check matrix into a first portion and a second portion, leave the first portion in the first row of the first parity check matrix, replace the second portion with zeros, append a second row, including the second portion, to the first parity check matrix, and fill a remainder of the second rows with zeros.

9. The system of claim 1, wherein:

the appended matrix is a first appended matrix; and the third module is configured to append a zero-circulant matrix to the first parity check matrix.

10. The system of claim 9, wherein the third module is configured to append a second appended matrix to the first parity check matrix.

11. The system of claim 10, wherein:

the zero-circulant matrix is appended to ends of rows of the first parity check matrix, ends of rows of the first appended matrix, and a last row of the second appended matrix; and the diagonal is across a portion of the first appended matrix and the zero-circulant matrix.

12. The system of claim 1, wherein:

the appended matrix is a first appended matrix; and the third module is configured to append a second appended matrix to the resultant parity check matrix.

13. The system of claim 1, wherein the third module is configured to remove a zero-circulant matrix from the first parity check matrix and include the zero-circulant matrix in the appended matrix.

14. The system of claim 1, wherein the third module is configured to locally interleave, via respective interleavers, columns of a circulant of the resultant parity check matrix.

15. The system of claim 14, wherein the third module is configured to globally interleave, via a single interleaver, columns of the resultant parity check matrix.

16. A method comprising:

generating a first parity check matrix;

appending an appended matrix to the first parity check matrix to generate a resultant parity check matrix, wherein appending the appended matrix to the first parity check matrix includes appending additional elements to the first parity check matrix; and receiving user data and encoding the user data based on the resultant parity check matrix, wherein the appended matrix includes (a) a diagonal with non-zero-circulants and (b) a zero-circulant structure, and the zero-circulant structure includes a plurality of zero-circulants.

17. The method of claim 16, further comprising determining a parameter, wherein:

the first parity check matrix has a preset structure, parity check redundancy, and a first weighted profile;

the appended matrix is appended to the first parity check matrix based on the parameter; and the resultant parity check matrix has a second weighted profile.

18. The method of claim 16, further comprising:

appending a zero-circulant matrix to the first parity check matrix, wherein the appended matrix is a first appended matrix; and appending a second appended matrix to the first parity check matrix, wherein the zero-circulant matrix is appended to ends of rows of the first parity check matrix, ends of rows of the first appended matrix, and a last row of the second appended matrix, and the diagonal is across a portion of the first appended matrix and the zero-circulant matrix.

19. The system of claim 1, wherein the second module is configured to append the appended matrix to the first parity check matrix to generate the resultant parity check matrix without changing values of the first parity check matrix.

20. The system of claim 8, wherein the third module is configured to divide the first row of the first parity check matrix into the first portion and the second portion while leaving one or more other rows of the first parity check matrix undivided.

21. The system of claim 8, wherein the third module is configured to divide the first row of the first parity check matrix into the first portion and the second portion while maintaining the remainder of the plurality of rows undivided.

* * * * *